(12) United States Patent
Hauptmann et al.

(10) Patent No.: US 6,570,512 B1
(45) Date of Patent: May 27, 2003

(54) CIRCUIT CONFIGURATION FOR QUANTIZATION OF DIGITAL SIGNALS AND FOR FILTERING QUANTIZATION NOISE

(75) Inventors: Jörg Hauptmann, Wernberg (AT); Peter Pessl, Noestl (AT); Dietmar Sträussnigg, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/856,382

(22) PCT Filed: Nov. 15, 1999

(86) PCT No.: PCT/DE99/03632

§ 371 (c)(1),
(2), (4) Date: Aug. 21, 2001

(87) PCT Pub. No.: WO00/31879

PCT Pub. Date: Jun. 2, 2000

(30) Foreign Application Priority Data

Nov. 20, 1998 (DE) .......................................... 198 53 673

(51) Int. Cl.[7] .............................................. H03M 3/00
(52) U.S. Cl. ............................ 341/77; 341/76; 341/200
(58) Field of Search ........................ 341/143, 76, 77, 341/200

(56) References Cited

U.S. PATENT DOCUMENTS

| 5,061,928 A | * | 10/1991 | Karema et al. | ............. | 341/143 |
| 5,345,233 A | * | 9/1994 | Nagata et al. | ................. | 341/76 |
| 5,369,403 A | | 11/1994 | Temes et al. | ................ | 341/143 |
| 5,442,354 A | * | 8/1995 | Cabler | .......................... | 341/143 |
| 6,005,505 A | * | 12/1999 | Linz | ............................ | 341/143 |

FOREIGN PATENT DOCUMENTS

DE    19722434    10/1998    ............ H03M/3/02

\* cited by examiner

Primary Examiner—Howard L. Williams
(74) Attorney, Agent, or Firm—Fish & Richardson P.C.

(57) ABSTRACT

The invention relates to a circuit configuration for quantization of digital signals and for filtering quantization noise. Said circuit configuration comprises a multitude of digital control loops connected in series and having quantizers. The digital signals having a word length of m-bits are fed to a first control loop in the series. The quantization error signal of each quantizer is filtered and fed back to the corresponding digital control loop. It is then fed to a downstream digital control loop. The quantized output signal of the first digital control loop is adapted to a third word length of u-bits which is smaller than the first word length. Except for the quantized output signal of the first digital control loop, the quantized output signals of the digital control loops of the series are respectively filtered by a digital filter. In an adder, said quantized output signals are then added to the first quantized output signal of the first digital control loop of the series to prevent quantization errors. The output signal of the adder has a second word length of n-bits and represents the quantized output signal of the circuit configuration.

7 Claims, 4 Drawing Sheets

CIRCUIT CONFIGURATION FOR QUANTIZATION OF DIGITAL SIGNALS AND FOR FILTERING QUANTIZATION NOISE

The invention relates to a circuit arrangement for quantizing digital signals and filtering the quantization noise.

BACKGROUND

Oversampling digital-to-analog converters operating according to the sigma-delta method have an interpolation filter for increasing sample rate, a downstream circuit arrangement for quantizing and filtering the quantization noise (noise-shaping loop) and a digital-to-analog converter with a short input word length.

U.S. Pat. No. 5,369,403 discloses a sigma-delta digital-to-analog converter with a small quantization error, which has a first and second digital control loop for quantization. The second digital control loop processes the quantization error of the first digital control loop. The quantized output signals of the first and second digital control loops are respectively converted into a first and second analog signal by a first and second digital-to-analog converter. The second analog signal is filtered in an analog fashion and added to the first analog signal, which has only a small quantization error. The complicated analog filtering of the second signal and the errors in the analog addition, which limits the linearity of the converted analog signal, are disadvantageous in this process.

DE 197 22434C discloses a circuit having a plurality of digital control loops, the quantization error signal of a first control loop being fed as input signal to a second control loop, and a digital high-pass filter additionally being present at the output of the second control loop. The filtered output signal of the second control loop is, however, added to the input signal of the circuit and the quantization error filtered in the first control loop.

DE 197 22434C discloses a circuit having a plurality of digital control loops, the quantization error signal of a first control loop being fed as input signal to a second control loop, and a digital high-pass filter additionally being present at the output of the second control loop. The filtered output signal of the second control loop is, however, added to the input signal of the dircuit and the quantization error filtered in the first control loop.

SUMMARY

The invention relates to a circuit arrangement for quantizing digital signals and filtering the quantization noise. The circuit arrangement has a multiplicity of series-connected digital control loops with quantizers. A first control loop of the series is fed the digital signals which have a first word length of m bits. The quantization error signal of each quantizer is filtered and fed back in the respective digital control loop. The quantization error signal of each quantizer is fed to a downstream digital control loop. The quantized output signal of the first digital control loop is adapted to a third word length of u bits, which is smaller than the first word length. Except for the quantized output signal of the first digital control loop, the quantized output signals of the digital control loops of the series are respectively filtered by a digital filter and are added in an adder to the quantized output signal of the first digital control loop of the series in order to delete the quantization errors, the output signal of said adder having a second word length of n bits and being the quantized output signal of the circuit arrangement. The quantization noise caused by the quantization error is advantageously reduced using digital means. A further advantage results from the exclusive use of digital means which permit an accuracy limited only by the word length of the computing circuits. Furthermore, digital means are simpler to use than analog means, particularly given integration of the circuit arrangement on a monolithic component.

The quantization error of the respective upstream digital control loop is deleted by the digital filtering of the output signal of each digital control loop apart from the first digital control loop and the summation of the output signals of each digital control loop. What remains is the quantization error of the last digital control loop of the series, since it is not followed by any further digital control loop for deleting the quantization error. It is advantageous in this case that even signals with a low oversampling of the basic signal can be quantized by this circuit arrangement with a very small quantization error. In such a case, the noise spectrum generated by a quantization error is filtered efficiently and deleted from the original useful signal spectrum of the sampled signal despite the useful signal spectra of the sampled signal which are obvious on the basis of a low sampling rate.

In a preferred embodiment, each digital filter has a high-pass filter. The noise spectrum, which is caused by the quantization error of the last digital control loop of the series circuit, is advantageously damped thereby at low frequencies and causes less interference to the spectral components of a useful signal, which are at low frequencies.

In a particularly preferred embodiment, each digital filter has two series-connected differentiators of first order. The simple design of each digital filter with digital means is advantageous. Only two subtractors and two time-delay elements are required for the design.

In a preferred embodiment, the quantizers quantize an input signal by cutting off the low-order bits of the input signal. The method of cutting off the low-order bits advantageously requires a very low outlay on circuitry.

In an alternative preferred embodiment, the quantizers quantize an input signal by rounding instead of by cutting off. This method is certainly more complicated in terms of circuitry than quantization by cutting off, but returns more accurate results.

Each digital control loop preferably has a limiter upstream of the quantizer, a filter structure for filtering the quantization error signal, and an adder which adds an input signal to the filtered quantization error signal. In this case, a limiter prevents overshooting of the range of values prescribed by the downstream circuit structures.

It is particularly preferred for each digital control loop to be at most of second order, in order to avoid stability problems. Orders higher than the second require means for improving the stability, as a result of which the outlay on circuitry for the digital control loop increases.

Further advantages, features and possible applications of the invention follow from the subsequent description of an exemplary embodiment in conjunction with the drawings, in which.

DESCRIPTION

Figure 1:
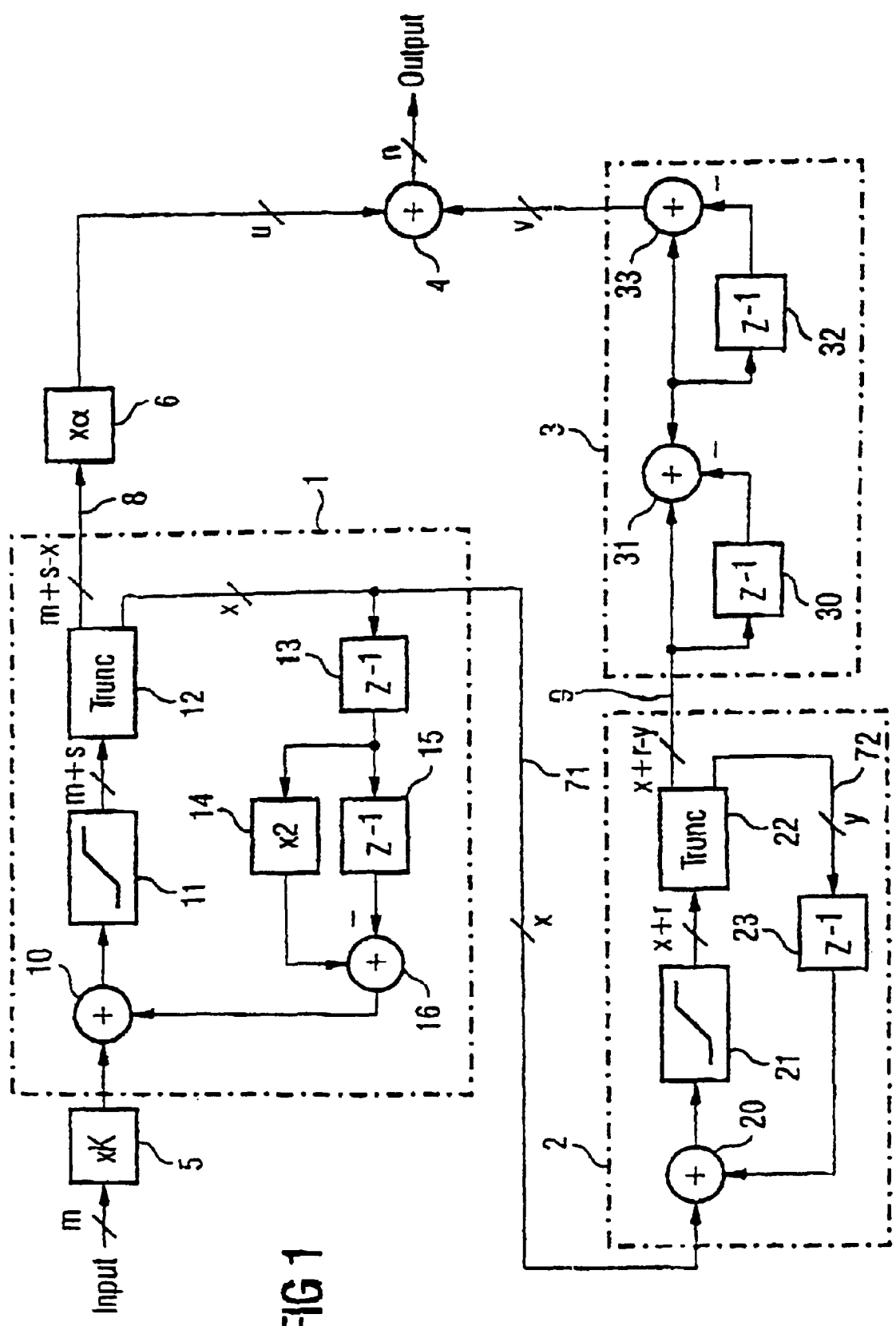
FIG. 1 shows a first exemplary embodiment of the circuit arrangement according to the invention for quantizing digital signals and filtering the quantization noise.

In FIG. 1, a digital input signal "Input" with a first word length of m bits is fed to a first multiplier 5. The first multiplier 5 multiplies the input signals "Input" by a constant factor k, which is less than one, and can be designed for this purpose as a shift register, for example. Multiplying by the constant factor k reduces the range of values of the input signal "Input" in order to avoid overflow into the downstream circuits. The output signal of the first multiplier 5 is fed to a first digital control loop 1.

The first digital control loop has a first adder 10 which adds a feedback signal to the signal fed to the first digital control loop 1. The output of the adder 10 is connected to a first limiter or saturator 11, which adapts the range of values of a fed signal to a word length of (m+s) bits. Connected, in turn, downstream of the first limiter or saturator 11 is a first quantizer 12 which separates an input signal into a first quantized signal 8 with the high-order (m+s−x) bits, and a first quantization error signal 71 with the low-order x bits of the input signal. However, it is also possible to quantize by rounding instead of by cutting off. The first quantization error signal 71 is filtered and fed back to the first adder 10. For filtering purposes, the feedback path has a first time-delay element 13, a downstream second time-delay element 15 and, in parallel, a second multiplier 14, which multiplies by a constant factor of 2 and can, for example, be designed as a shift register. The output signal of the second time-delay element 15 is subtracted in a subtractor 16 from the output signal of the second multiplier 14.

The quantization noise contained in the first quantized signal 8 is suppressed at low frequencies and rises at higher frequencies owing to this feedback, also denoted error feedback, of the quantization error which is weighted in terms of frequency. Consequently, the term noise-shaping loop is also used. For reasons of stability, the order of the first digital control loop should not be higher than two, and this is ensured here by two time-delay elements in the feedback path. The first digital control loop is therefore a noise-shaping loop of second order.

The first quantized signal 8 is fed to a third multiplier 6, which adapts the word length of the first quantized signal 8 of (m+s−x) bits to a third word length of u bits, which is smaller than the first word length of m bits. The third multiplier 6 can be designed for this purpose as a simple shift register, for example.

The first quantization error signal 71 is fed to a second control loop 2.

The second control loop 2 is designed as a noise-shaping loop of first order has for this purpose a second adder 20, which adds the first quantization error signal 71 as input signal to a second filtered quantization error signal 72, which has a word length of y bits. The output signal of the second adder 20 is fed to a second limiter or saturator 21 for adapting the word length to (x+r) bits, and to a second quantizer 22 downstream of the second limiter or saturator 21. The second quantizer 22 separates the fed signal into a second quantized signal 9 with the high-order (x+r−y) bits, and a second quantization error signal 72 with the low-order y bits of the fed signal. The second quantization error signal 72 is fed for filtering to a third time-delay element 23, whose output signal is fed, in turn, to the second adder 20.

The second quantized signal 9, which now has a word length of (x+r−y) bits, is fed to a digital filter 3. The digital filter 3 has a first and a second, series-connected differentiator of first order. The first and second differentiators respectively have a fourth time-delay element 30 and a fifth time-delay element 32 and a second subtractor 31 and a third subtractor 33. The transfer function of the digital filter 3 corresponds to a high-pass transfer function.

The output signal of the digital filter 3 is added to the output signal of the third multiplier 6 in a second adder 4 to form an output signal "Output" of the circuit arrangement with a second word length of n bits, which is smaller than the first word length of m bits.

The quantization error produced in the first digital control loop 1 is deleted by the filtering in the digital filter 3. Only the quantization error of the second digital control loop 2 is left over.

Figure 2:
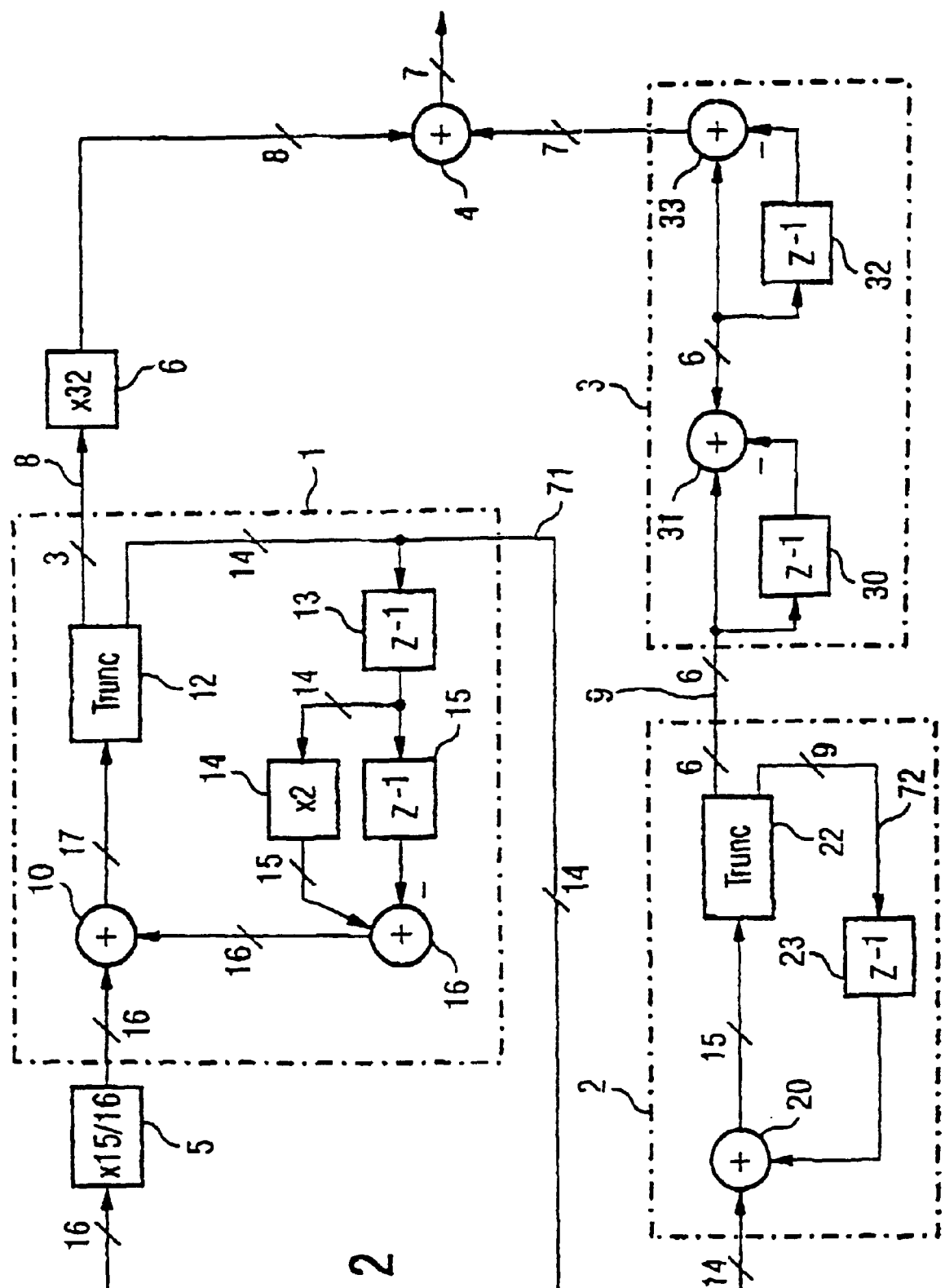
FIG. 2 shows a second exemplary embodiment of the circuit arrangement according to the invention for quantizing digital signals and filtering the quantization noise.

FIG. 2 shows an exemplary embodiment of the circuit arrangement according to the invention for quantizing digital signals and filtering the quantization noise, in which the word lengths of the individual signals are entered. The elements in FIG. 2 are denoted by the same reference symbols for the elements from FIG. 1. Missing by contrast with the circuit illustrated in FIG. 1 are the first and second limiters or saturators 11 and 21, respectively, which can be omitted when the range of values prescribed by the individual elements is not overshot.

Furthermore, there is no need for a transfer signal of the second subtractor 31, since it can be shown that the range of values prescribed by the second subtractor 31 is not overshot. The same holds for the second adder 4.

Figure 3:
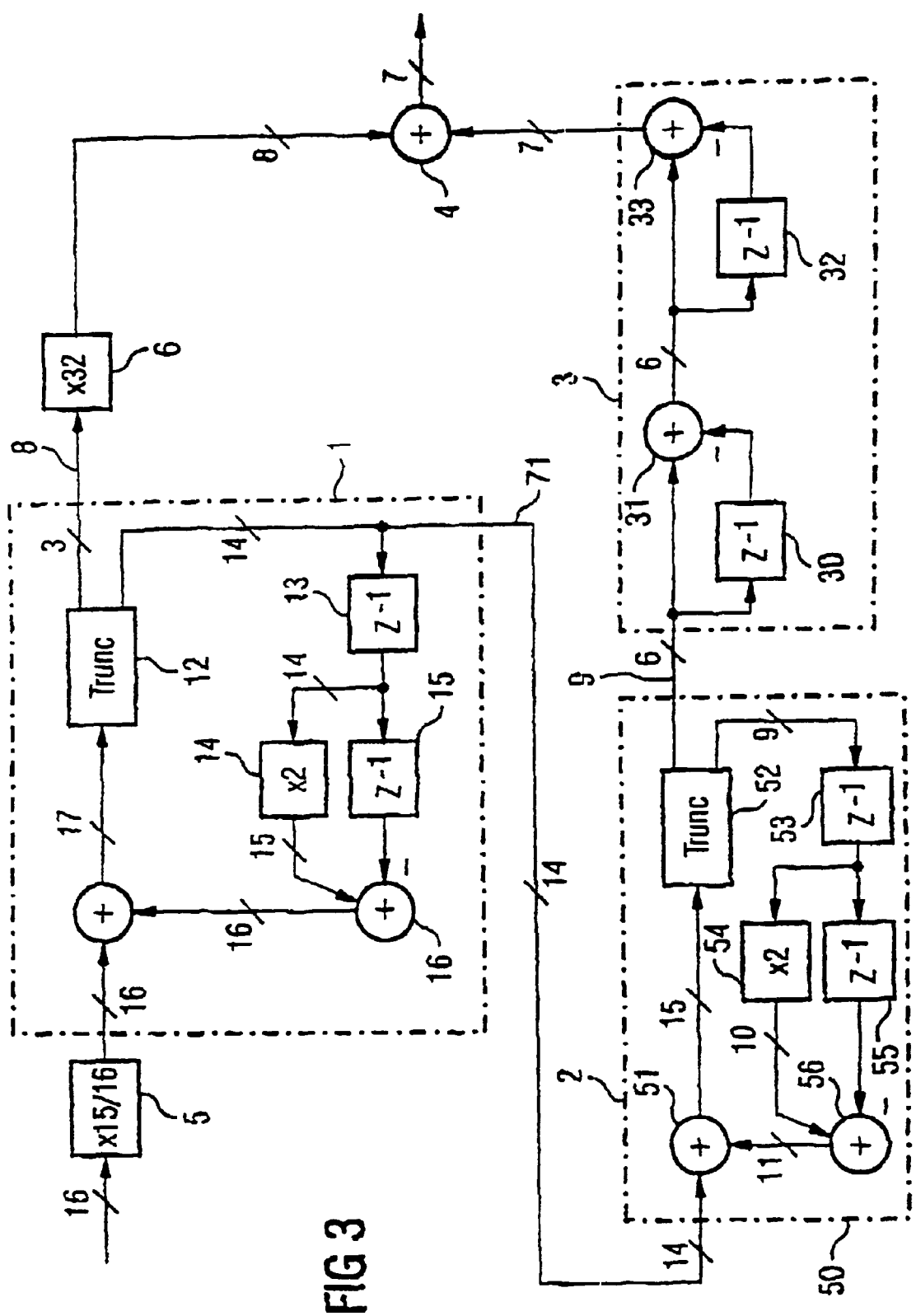
FIG. 3 shows a third exemplary embodiment of the circuit arrangement according to the invention for quantizing digital signals and filtering the quantization noise.

FIG. 3 shows an exemplary embodiment of the circuit arrangement according to the invention for quantizing digital signals and filtering the quantization noise, having a first digital control loop 1, which is the same digital control loop as in FIG. 2, and a second digital control loop 50, which has the same design as the first digital control loop 1. Consequently, two noise-shaping loops of second order are connected in series, resulting overall in a noise-shaping loop of fourth order.

The second digital control loop 50 has an adder 51, a quantizer 52 downstream of the adder 51, and a feedback path. Like the feedback path in the first digital control loop 1, the feedback path has a first time-delay element 53, a second time-delay element 55 downstream of the first time-delay element 53, and a multiplier 54 in parallel therewith. The output signal of the second time-delay element 55 and of the multiplier 54 are fed to a subtractor 56, whose output signal is fed to the adder 51 for the purpose of adding to the input signal of the second digital control loop.

The more complicated design of the second digital control loop 50 (by comparison with the design of the second digital control loop 2 of the first and second exemplary embodiments) permits a lower sampling rate of the signal to be quantized in conjunction with a signal-to-noise ratio, which is equal to the signal-to-noise ratio of the circuit arrangements of the first and second exemplary embodiments, of the quantized output signal.

In the case of a desired signal-to-noise ratio of 94 dB, a 16-bit input signal and a 7-bit output signal of the circuit arrangement for quantizing digital signals and filtering the quantization noise, the sampling rate of the input signal can be reduced from twelve-fold oversampling to eight-fold oversampling.

Figure 4:
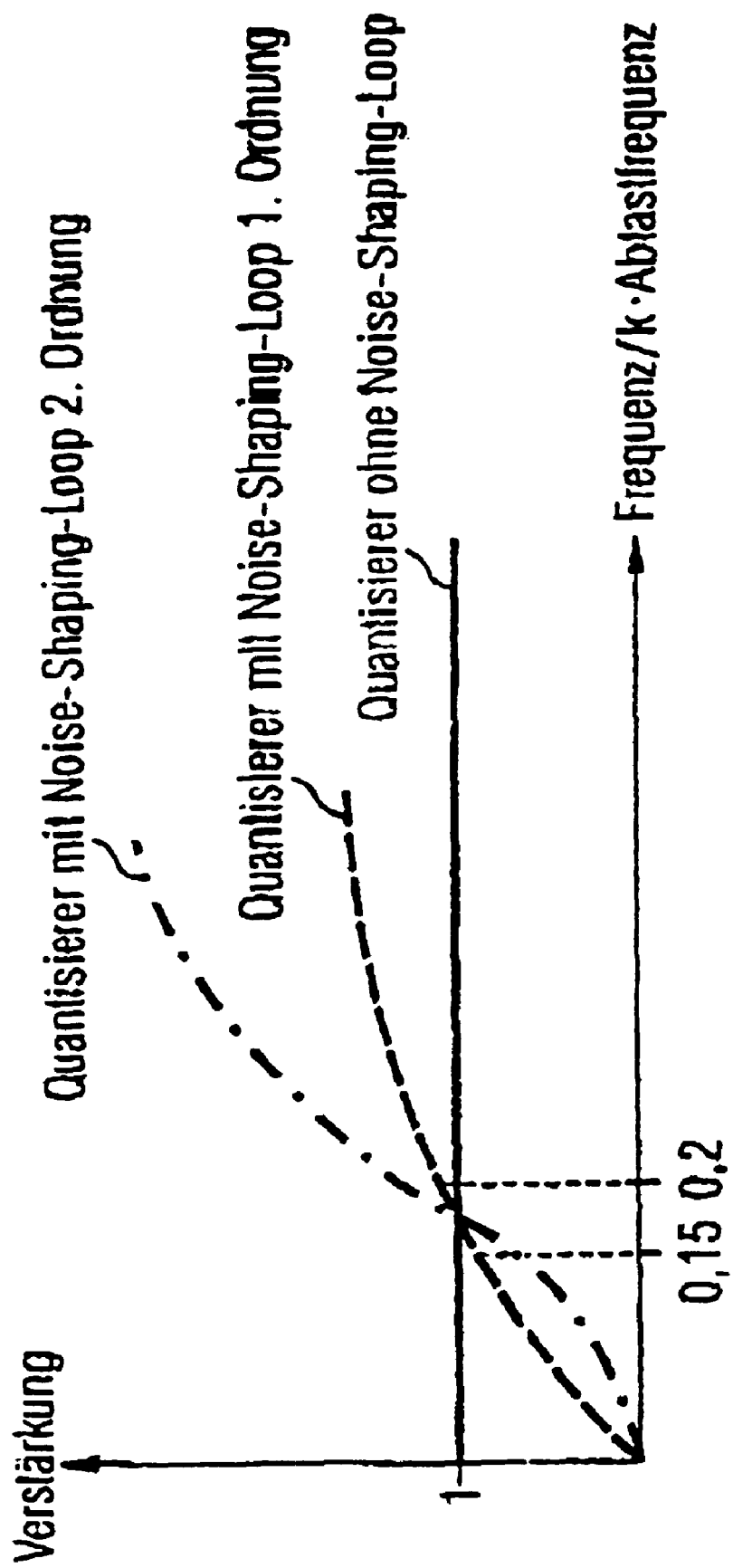
FIG. 4 shows the quantization noise spectrum of a quantizer without a noise-shaping loop and with a noise-shaping loop of first and second orders.

FIG. 4 shows a quantization noise spectrum of a quantizer without a noise-shaping loop, and with a noise-shaping loop of first and second orders. It is to be seen therefrom that although the noise shaping somewhat increases the noise power overall, at low frequencies the noise power is lower by comparison with a simple quantizer without noise shaping. A low-pass filter connected downstream of a digital-to-analog converter which converts the quantized signal into an analog signal should therefore have a steep filtering characteristic in order to damp the higher frequency noise component of the quantization noise.

What is claimed is:

1. A circuit arrangement for quantizing digital signals and filtering the quantization noise, the circuit arrangement comprising:

a multiplicity of digital control loops, each of the digital control loops including a quantizer, each quantizer having a quantization-error signal output for providing a quantization-error signal and a quantized signal output for providing a quantized output signal;

a first digital control loop from the multiplicity of digital control loops being configured to receive a digital signal having a first word length, the quantization error signal of each quantizer being filtered and fed back within the respective digital control loop, and the quantization error signal of the first digital control loop being fed downstream to a second digital control loop from the multiplicity of digital control loops, the quantized output signal of the first digital control loop having a third word length smaller than the first word length; and the quantized output signal of the second digital control loop being filtered by a digital filter downstream of the second digital control loop and added, in an adder, to the quantized output signal of the first digital control loop to delete quantization errors, the output signal of the adder having a second word length and being the quantized output signal of the circuit arrangement.

2. The circuit arrangement as claimed in claim 1, wherein each digital filter comprises a high-pass filter.

3. The circuit arrangement as claimed in claim 1, wherein each digital filter comprises two series-connected differentiators of first order.

4. The circuit arrangement as claimed in claim 1, wherein each quantizer quantizes an input signal by truncating low-order bits of the input signal.

5. The circuit arrangement as claimed in claim 1, wherein each quantizer quantizes an input signal by rounding-off the input signal.

6. The circuit arrangement as claimed in claim 1, wherein each digital control loop comprises:

a limiter upstream of the quantizer, a filter structure downstream from the limiter for filtering the quantization error signal and generating a filtered quantization error signal, and an adder configured to add an input signal to the filtered quantization error signal.

7. The circuit arrangement as claimed in claim 1, wherein each digital control loop is at most of second order.

* * * * *